United States Patent [19]

Nakamura

[11] Patent Number: 4,932,585

[45] Date of Patent: Jun. 12, 1990

[54] METHOD AND APPARATUS FOR SOLDER PLATING AN OBJECT

[75] Inventor: Hideki Nakamura, Chiba, Japan

[73] Assignee: Senju Metal Industry Co., Ltd., Tokyo, Japan

[21] Appl. No.: 376,295

[22] Filed: Jul. 6, 1989

[30] Foreign Application Priority Data

Apr. 20, 1989 [JP] Japan .................. 1-98938

[51] Int. Cl.⁵ .................. B23K 1/08; H05K 3/34
[52] U.S. Cl. .................. 228/208; 228/215;
228/254; 228/256; 228/33; 228/39; 228/56.1;
228/56.2; 228/40; 118/505; 118/406; 118/429;
427/431; 427/433
[58] Field of Search .............. 228/208, 214, 215, 254,
228/256, 259, 19, 36, 39, 40, 56.1, 56.2;
118/505, 406, 423, 429; 427/431, 433

[56] References Cited

U.S. PATENT DOCUMENTS

| | | | |
|---|---|---|---|
| 3,604,609 | 9/1971 | Walls | 228/40 |
| 3,828,419 | 8/1974 | Wanner | 228/40 |
| 3,989,180 | 11/1976 | Tardoskegyi | 228/37 |
| 4,011,980 | 3/1977 | Dvorak et al. | 228/37 |
| 4,162,034 | 7/1979 | Pavlas | 228/37 |
| 4,315,590 | 2/1982 | Kondo | 118/429 |
| 4,506,820 | 3/1985 | Brucker | 118/406 |
| 4,659,002 | 4/1987 | Wallgren et al. | 118/429 |

FOREIGN PATENT DOCUMENTS 144873 12/1985 Japan .................. 228/12

*Primary Examiner*—Nicholas P. Godici
*Assistant Examiner*—Samuel M. Heinrich
*Attorney, Agent, or Firm*—Tarolli, Sundheim & Covell

[57] ABSTRACT

A method and an apparatus for solder plating parallel arranged leads on an electronic device, e.g. QFP having leads on four sides or SOLC having leads on two sides. A metal plate of solder wettable material having an inclined upper surface is placed in a molten solder bath. The electronic device, with the leads to be solder plated exposed, is lowered horizontally in the solder bath and is pulled out horizontally. A large quantity of solder adhering on the inclined plate pulls solder adhering on the leads sequentially along an inclined surface of the plate to obtain uniform thickness of solder plating on the leads without causing bridging.

5 Claims, 5 Drawing Sheets

METHOD AND APPARATUS FOR SOLDER PLATING AN OBJECT

BACKGROUND OF THE INVENTION

1. FIELD OF THE INVENTION

The present invention relates to a method and apparatus for solder plating an object having many parallel aligned positions to be solder plated, e.g. leads of an electronic part of a QFP (Quad Flat Package IC) having leads on four sides, or a SOIC (Small Outlet IC) having leads on both sides.

2. DESCRIPTION OF THE PRIOR ART

Electronic part such as QFP or SOIC utilizes ferrous or copper alloy as lead material. However, as the IC circuit and the leads are connected by gold wires, the leads are gold plated to fit with gold wires. The gold plated lead has a poor soldering property and further, as gold easily melts into solder material to form a brittle metal to metal compound of gold and tin during the soldering process thus producing a weak soldered product. Thus, conventionally, the gold plated leads are solder plated to improve affinity to solder when the leads are connected by soldering to other electronic parts on a printed circuit board.

A conventional solder plating process of leads is performed such that for example lead wires of QFP, flux is covered on the leads and leads on one side are kept perpendicular to the molten solder liquid surface and are dipped into the molten solder and then, the QFP is turned 90° to align the leads of the next side to face the molten solder. The process is repeated so that four processes must be performed to solder plate all the lead wires on one QFP.

Such a conventional solder plating process nesccecitates four dipping processes to one QFP which has leads of four sides. Further, by dipping the leads into the molten solder bath, solder apts to bridge between adjacent leads when the distance between the adjacent leads is narrow.

Accordingly, the object of the present invention is to provide a method and an apparatus of solder plating which can solder plate by one dipping process into molten solder for leads of electronic parts such as QFP which has leads on four sides without causing bridging between the adjacent leads.

SUMMARY OF THE INVENTION

When an elongated member is dipped in a molten solder bath and is pulled out in an inclined state, the molten solder adhered on the elongated member is pulled off by a large quantity of molten metal in the bath at the separating position between the member and the liquid surface, so that thin solder plating can be obtained. The process moves sequentially from one end of the member to the other end and results in uniform and thin solder plating along the length of the member. The present invention utilizes this condition.

Leads on two sides of the SOIC, and lead wires on four sides of QFP can be dipped simultaneously into a molten solder. However, the leads cannot all be pulled out from the liquid in an inclined state. Thus, according to the present invention, inclined metal plate which is wettable with molten solder is dipped into the molten liquid to pull solder adhered on the leads sequentially to obtain a uniform solder plating on the leads.

The method of solder plating, according to the present invention is that by placing an upper inclined metal plate of solder wettable material under a member having many parallel arranged portions to be solder plated, contacting molten solder with the portions and the plate, and then separating the portions and the plate from the molten solder.

The apparatus for solder plating comprises an upper inclined metal plate of solder wettable material, a molten solder bath having the metal plate in the bath, a jig covering a member having many parallel arranged portions to be solder plated and leaving said portions uncovered, and a vertically moving device to move the jig with the member into the molten solder bath.

DESCRIPTION OF THE PREFERRED EMBODIMENT

Figure 1:
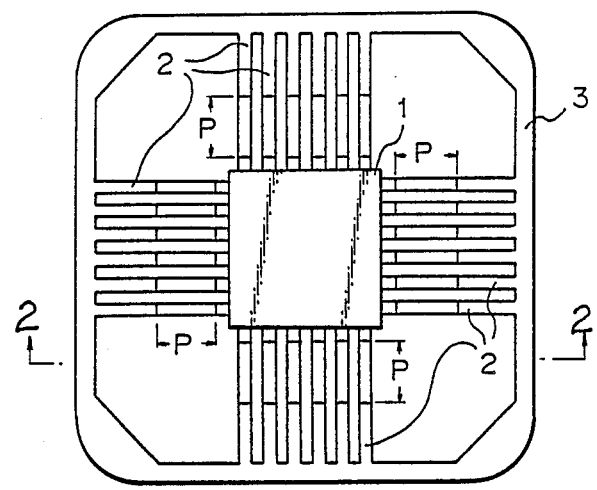
FIG. 1 is a plan view of a QFP having leads to be solder plated.
Figure 2:
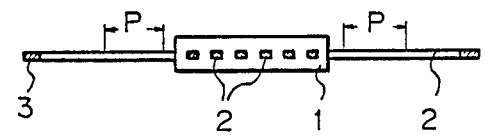
FIG. 2 is a sectional view along line II—II of FIG. 1.

Referring to FIGS. 1 and 2, a QFP (Quad Flat Package IC) having leads to be solder plated is shown. The QFP includes an IC in a body 1 and the IC circuit is wire bonded with leads 2 by gold wires. The leads 2 are integrally connected to each other by a peripheral frame 3. The leads 2 are gold plated on whole surfaces and a portion shown as P is to be solder plated. After the solder plating, outer portions from P of the leads Z are separated and the solder plated portions are used to solder with one or more printed circuit boards.

The solder plating process of the leads of the QFP. according to the present invention will be explained referring to FIGS. 3a to 3d.

(a) The QFP is placed horizontally, and the body is covered except the leads. Then, the leads are placed on an inclined solder wicking plate 3 which is a solder wettable metallic plate.

(b) After the leads of the QFP are placed on a predetermined position relative to the metal plate 3, molten solder S is injected upward to dip the leads 2 in the molten solder.

(c) When the leads 2 are completely in the molten solder. injection of molten solder is stopped and the liquid level of the molten solder is lowered. Molten solder is separated sequentially from the leads from left side in FIG. 3c which is far from the solder absorbing plate 3. As a large quantity of solder is adhered on the solder wicking plate 3, molten solder adhered on the leads is pulled by the solder on the plate 3 so that uniform and thin solder plating on the leads can be obtained.

Figure 3A:
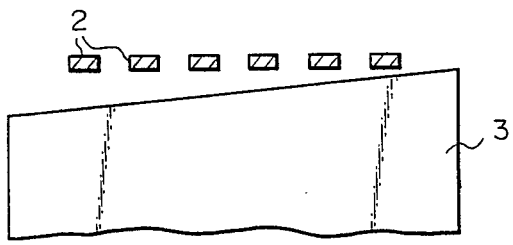
FIG. 3(a) to 3(d) are illustrations to explain the method according to the present invention.
Figure 3B:
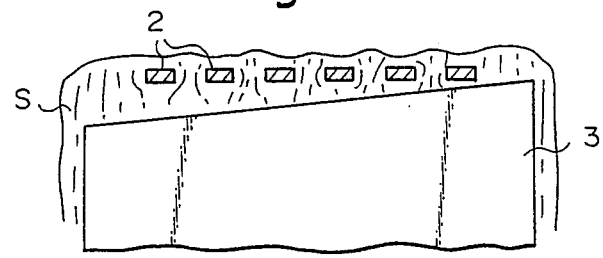
Figure 3C:
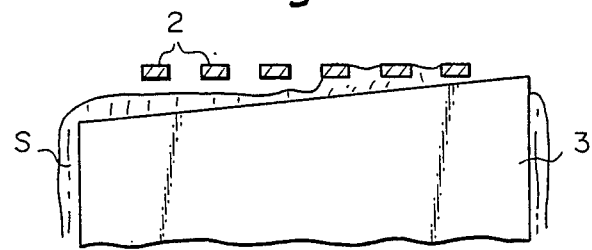
Figure 3D:
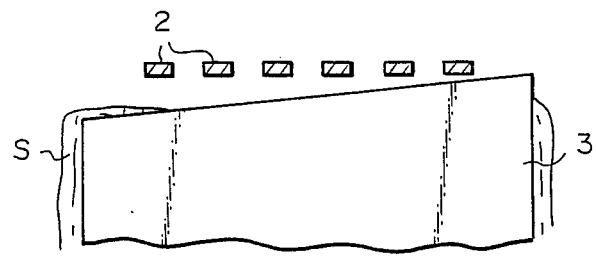

(d) As the molten solder level is lowered further, molten solder is separated from the last lead which is nearest to the metal plate S, i.e. right end lead shown in FIG. 3d. Also, molten solder adhered on the lead is pulled by the solder on the plate 3 to maintain suitable thickness.

An apparatus of solder plating, according to the present invention, will be explained by referring to FIGS. 4 to 8.

Figure 8:
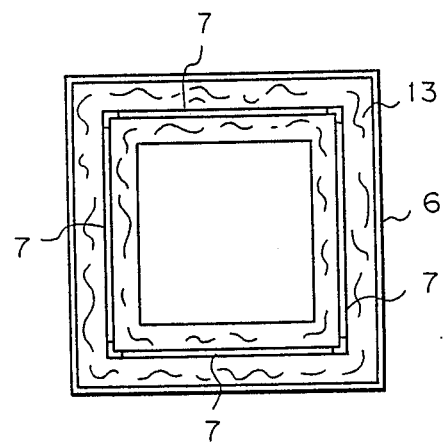
FIG. 8 is a plan view of molten solder bath shown in FIG. 4.

The apparatus includes a jig 4, a vertically moving device 5, a molten solder bath 0 and a solder wettable metal plate 7. The jig 4 has a base 8 and a cover 9 and is formed by solder repulsing material, e.g. titanium or SUS-403 stainless steel. The base 8 and the cover 9 cover the body 1 of the QFP exposing portions of the leads 2 to be soldered by openings 10. The base 8 is mounted on the vertically moving device S and is lowered as shown by an arrow A to the molten solder bath 6. Pins 11 act as guide means to align the base 8 and the cover 9, and pins 12 act as guides to align the QFP on predetermined position of the jig 4. The molten solder bath 6 downward from the jig 4 is shown in FIG. 8 and aligns with the opening 10 of the base 8 and the cover 9 and includes a plurality of molten solder nozzles 13 at the bottom. In the general center portion of the bath 6, the solder wettable plates 7 having upper inclined surface are vertically arranged.

The solder wettable plates are four, to solder plate the leads of the QFP having leads on four sides. The plate 7 is formed from solder wettable material. Experimentally, the inclination of the solder absorbing plate is preferably between 4° to 7° from the horizontal to obtain the desired solder wetting effect along the length thereof. Thus, the inclination of the plate shown in the drawings is very exaggerated.

The operation of the apparatus shown will be explained.

Figure 4:
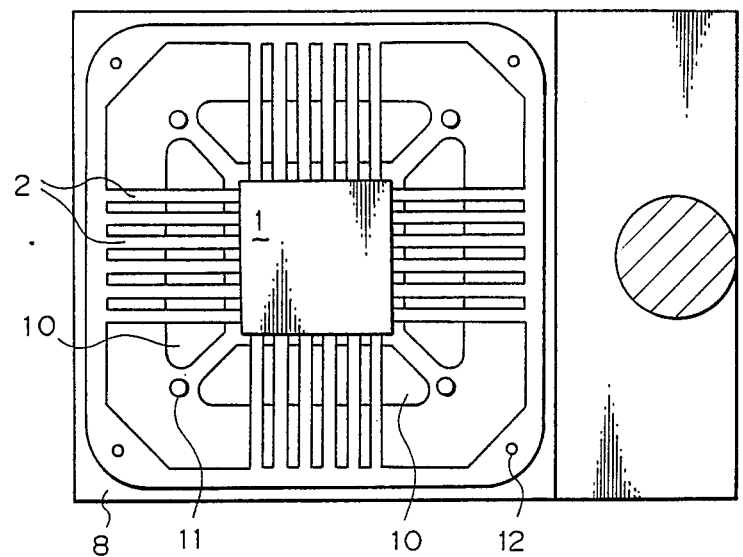
FIG. 4 is a front view of an apparatus according to the present invention.
Figure 5:
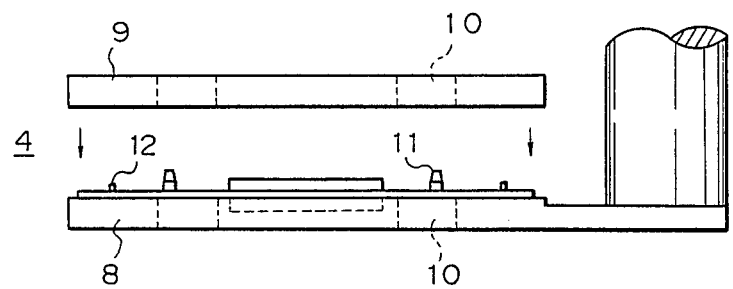
FIG. 5 is a portion of FIG. 4 placing a QFP on a base plate.
Figure 7:
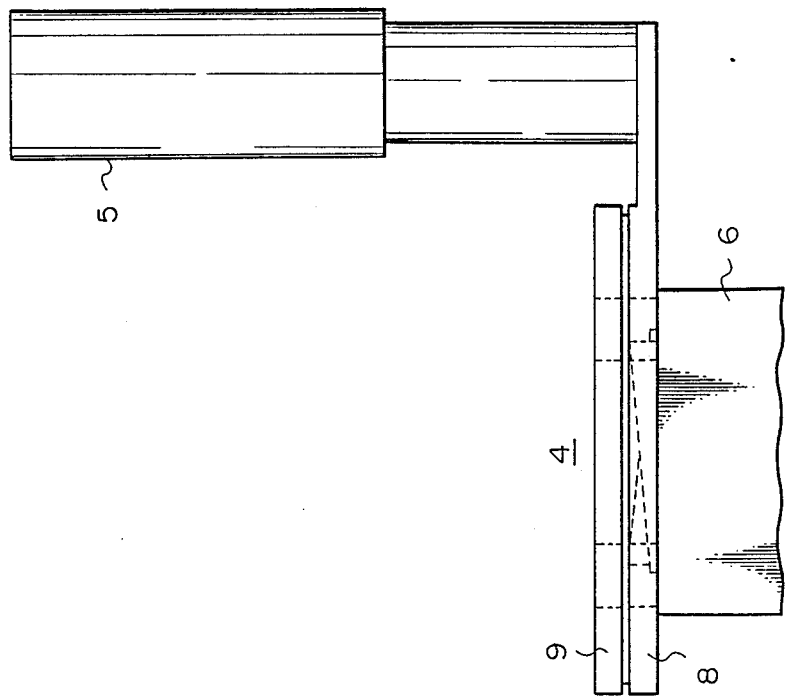
FIG. 7 is a front view of the apparatus of FIG. 4 while solder plating.
Figure 6:
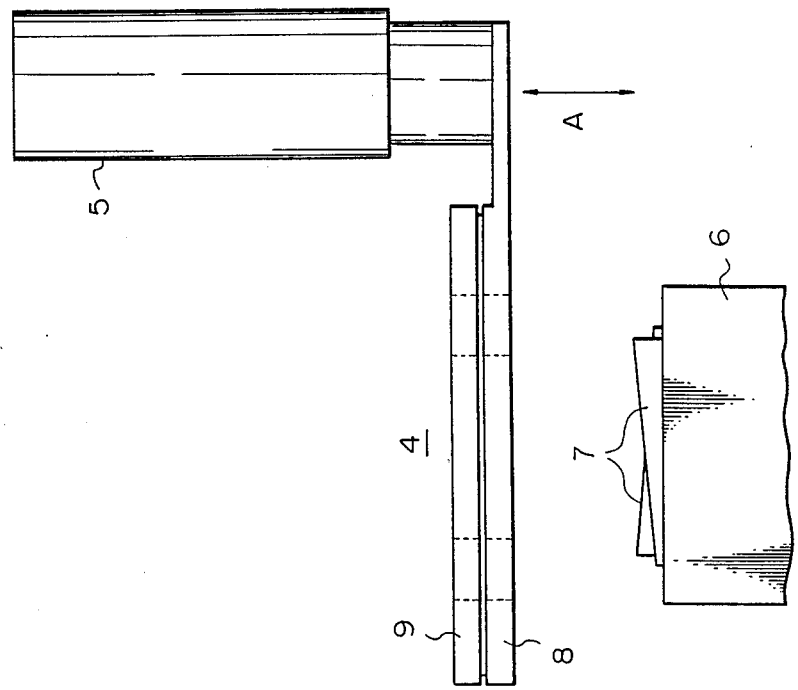
FIG. 6 is a plan view of FIG. 5.

At first a QFP is placed on a predetermined position of the base 8 of the jig 4 and the cover 9 is secured on the base 8 by clamp means, not shown, as shown in FIG. 4. Then, the vertical moving device lowers the jig 4 on the molten solder bath 6 as shown in FIG. 7. When the lower surface of the jig 4 engages with the molten solder bath 6, molten solder is injected by a pump, not shown. The liquid level of the molten solder moves upward into the opening 10 of the jig 4 to dip the leads of the QFP in the opening 10. When the leads are dipped in the molten solder, the pump is stopped and the liquid level of the molten solder is lowered. As explained before referring to FIGS. 3a to 3d, the leads of the QFP are solder plated uniformly without causing bridge between adjacent leads.

In the illustrated embodiment, solder plating on leads of an electronic part such as QFP is explained. However, the present invention can be applied also to any parallel arranged portions to be soldered of a part other than an electronic part.

As described in detail, the method and apparatus of the present invention can solder plate parallel arranged leads of a narrow distance without causing bridging between adjacent leads, and can also solder plate many sided leads of an electronic part simultaneously by contacting only once with molten solder. Thus, the solder plating process is reliably and economically performed.

What is claimed is:

1. A method of solder plating characterized by placing a metal plate of solder wettable material having an inclined upper surface, under a member having many parallel arranged portions to be solder plated, contacting molten solder with the portions and the plate, and then separating the portions and the plate from the molten solder.

2. An apparatus for solder plating comprising a metal plate of solder wettable material having an inclined upper surface, a molten solder bath having the metal plate in the bath, a jig covering a member having many parallel arranged portions to be solder plated and leaving said portions uncovered, and a vertically moving device to move the jig with the member into the molten solder bath.

3. An apparatus according to claim 2, in which the inclination of the upper surface of the metal plate is at about 4 to 7 degree to the horizontal.

4. An apparatus according to claim 2, in which said metal plate is opposed to center portions of the portions to be solder plated.

5. A method of solder plating comprising positioning a plurality of elements to be solder plated above an inclined upper surface of a solder wettable member, at least partially covering surfaces of the plurality of elements and the upper surface of the solder wettable member with a body of molten solder, and, thereafter, sequentially removing the plurality of elements form the body of molten solder, said step of sequentially removing the plurality of elements from the molten body of solder including reducing the distance which the upper side surface of the molten body of solder is disposed above the solder wettable member.

* * * * *

UNITED STATES PATENT AND TRADEMARK OFFICE
CERTIFICATE OF CORRECTION

PATENT NO. : 4,932,585

DATED : June 12, 1990

INVENTOR(S) : Hideki Nakamura

It is certified that error appears in the above-identified patent and that said Letters Patent is hereby corrected as shown below:

Column 4, Line 43, Claim 5, change "form" to --from--.

Signed and Sealed this

Sixteenth Day of July, 1991

Attest:

HARRY F. MANBECK, JR.

*Attesting Officer*   Commissioner of Patents and Trademarks